(12) United States Patent
Takayama et al.

(10) Patent No.: US 10,192,719 B2
(45) Date of Patent: Jan. 29, 2019

(54) PLASMA PROCESSING METHOD

(71) Applicant: Tokyo Electron Limited, Tokyo (JP)

(72) Inventors: Takamitsu Takayama, Miyagi (JP); Akitoshi Harada, Miyagi (JP); Hideaki Yakushiji, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/962,407

(22) Filed: Dec. 8, 2015

(65) Prior Publication Data

US 2016/0196957 A1 Jul. 7, 2016

(30) Foreign Application Priority Data

Jan. 6, 2015 (JP) ................. 2015-000694

(51) Int. Cl.
| | |
|---|---|
| H01J 37/32 | (2006.01) |
| B44C 1/22 | (2006.01) |
| C03C 15/00 | (2006.01) |
| C03C 25/68 | (2006.01) |
| C23F 1/00 | (2006.01) |
| H01L 21/302 | (2006.01) |
| H01L 21/461 | (2006.01) |

(52) U.S. Cl.
CPC .. *H01J 37/32091* (2013.01); *H01J 37/32165* (2013.01); *H01J 37/32706* (2013.01)

(58) Field of Classification Search
CPC ................................. H01J 37/32513
USPC ............................................. 216/67; 206/67
See application file for complete search history.

(56) References Cited

U.S. PATENT DOCUMENTS

| | | | | |
|---|---|---|---|---|
| 2008/0068774 A1* | 3/2008 | Sumiya | ............ | H01J 37/32091 361/235 |
| 2008/0110859 A1* | 5/2008 | Koshiishi | .......... | H01J 37/32027 216/67 |
| 2012/0152914 A1* | 6/2012 | Matsuura | ................ | G03F 7/427 219/121.42 |
| 2012/0214305 A1* | 8/2012 | Radwan | ............ | H01L 21/31116 438/675 |

FOREIGN PATENT DOCUMENTS

| | | |
|---|---|---|
| JP | 2002-100614 | 4/2002 |
| JP | 2003-124198 | 4/2003 |
| JP | 2004-095909 | 3/2004 |
| JP | 2009-239062 | 10/2009 |

\* cited by examiner

*Primary Examiner* — Thomas T Pham
(74) *Attorney, Agent, or Firm* — IPUSA, PLLC

(57) ABSTRACT

A plasma processing method is provided that includes a step of loading a substrate into a chamber where a plasma process is to be executed, a step of applying a high frequency bias power that has a lower frequency than a high frequency excitation power for plasma excitation to a mounting table on which the substrate is mounted, and a step of applying a DC voltage to an electrostatic chuck configured to electrostatically attract the substrate that is mounted on the mounting table. The step of applying the DC voltage is performed after the step of applying the high frequency bias power.

8 Claims, 8 Drawing Sheets

PLASMA PROCESSING METHOD

BACKGROUND OF THE INVENTION

1. Field of the Invention

The present invention relates to a plasma processing method.

2. Description of the Related Art

Plasma processing apparatuses are used for implementing fine processing technology such as etching on a substrate using the action of a plasma. A capacitively coupled plasma (CCP) processing apparatus having parallel plate electrodes is one example of a plasma processing apparatus. The capacitively coupled plasma processing apparatus performs plasma processing on a substrate by applying a high frequency power to a pair of electrodes facing each other within a chamber and generating a plasma from a gas that is supplied to the chamber.

In such plasma processing apparatuses, a lightning-like abnormal discharge, generally referred to as "arcing", may occur at the surface of the substrate during plasma processing. In turn, techniques for suppressing the occurrence of arcing at the surface of the substrate have been proposed (see e.g., Japanese Laid-Open Patent Publication No. 2004-95909).

In a case where an electrostatic chuck that electrostatically attracts a substrate to a mounting table is provided in a plasma processing apparatus, a potential difference between the mounting table and its surrounding members may be created when a DC voltage HV for electrostatically attracting the substrate to the electrostatic chuck is applied to the mounting table, and particles within the chamber may be prone to electrically gather in the vicinity of the substrate. When a high frequency power for plasma excitation is applied to the mounting table in such a state, a charge between the substrate and the electrostatic chuck may be discharged toward the plasma, and a Coulomb force created by the potential difference between the substrate and the electrostatic chuck may be reduced to thereby cause a reduction in the attraction force of the electrostatic chuck. As a result, adhesion between the substrate and the electrostatic chuck may decrease, and a gap between the substrate and the electrostatic chuck may be enlarged such that particles may be more likely to enter the gap.

SUMMARY OF THE INVENTION

In view of the above problems, an aspect of the present invention is directed to suppressing particles from being drawn toward a substrate when a DC voltage HV is applied.

According to one embodiment of the present invention, a plasma processing method is provided that includes a step of loading a substrate into a chamber where a plasma process is to be executed, a step of applying a high frequency bias power that has a lower frequency than a high frequency excitation power for plasma excitation to a mounting table on which the substrate is mounted, and a step of applying a DC voltage to an electrostatic chuck configured to electrostatically attract the substrate that is mounted on the mounting table. The step of applying the DC voltage is performed after the step of applying the high frequency bias power.

DESCRIPTION OF THE PREFERRED EMBODIMENTS

Figure 1:
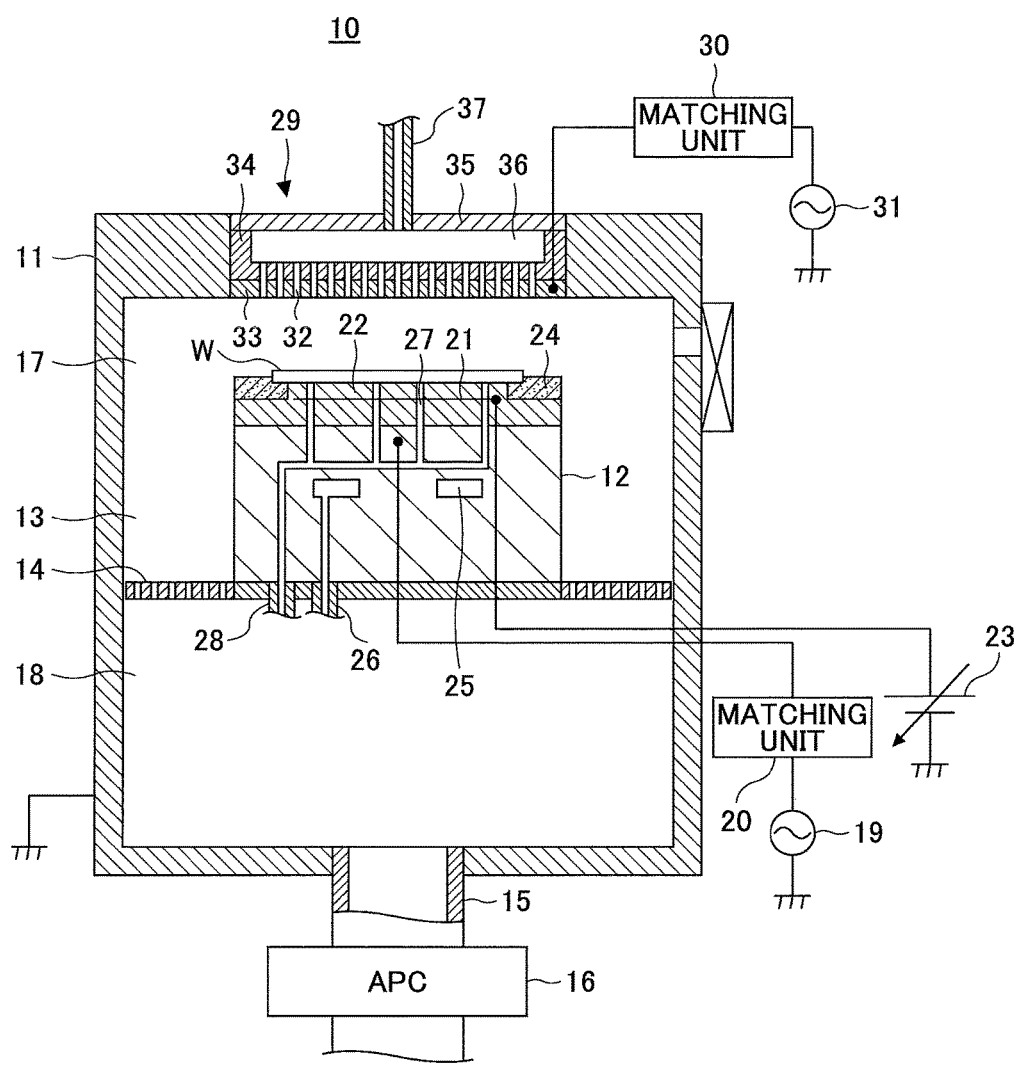
FIG. 1 is a longitudinal cross-sectional view of a plasma processing apparatus.

In the following, embodiments of the present invention will be described with reference to the accompanying drawings. Note that in the following descriptions and accompanying drawings, elements having substantially the same functions or features may be given the same reference numerals and overlapping descriptions thereof may be omitted.

[Overall Configuration of Plasma Processing Apparatus]

First, an overall configuration of a plasma processing apparatus 10 according to an embodiment of the present invention is described with reference to FIG. 1. The plasma processing apparatus 10 includes a cylindrical chamber 11 made of aluminum or the like that is capable of being sealed. The chamber 11 is grounded. A mounting table 12 made of a conductive material such as aluminum is provided within the chamber 11. The mounting table 12 is a cylindrical column that holds a semiconductor wafer (also referred to as "wafer W" hereinafter). The mounting table 12 also acts as a lower electrode.

An exhaust path 13 is formed between a side wall of the chamber 11 and a side face of the mounting table 12. The exhaust path 13 is for discharging gas toward the upper side of the mounting table 12 to the exterior of the chamber 11. An exhaust plate 14 is arranged at an intermediate section of the exhaust path 13. The exhaust plate 14 is a plate-like member having multiple holes and acts as a partition plate that partitions the chamber 11 into an upper portion and a lower portion. The upper portion of the chamber 11 partitioned by the exhaust plate 14 corresponds to a reaction chamber 17 in which plasma processing is performed. The lower portion of the chamber 11 corresponds to an exhaust chamber (manifold) 18. An exhaust pipe 15 for discharging gas within the chamber 11 to the exterior is connected to the exhaust chamber 18. The exhaust plate 14 prevents a plasma generated in the reaction chamber 17 from leaking into the exhaust chamber 18 by trapping or reflecting the generated plasma. The exhaust pipe 15 is connected to an exhaust system (not shown) via an APC (Adaptive Pressure Control: Automatic Pressure Control) valve 16. The exhaust system reduces the pressure within the chamber 11 to maintain the interior of the chamber 11 to a predetermined degree of vacuum.

A first high frequency power source 19 is connected to the mounting table 12 via a matching unit 20. For example, the first high frequency power source 19 may supply a high frequency bias power having a frequency within a range of 400 kHz to 13.56 MHz (also referred to as "high frequency bias power LF" hereinafter) to the mounting table 12. The matching unit 20 is configured to suppress the reflection of the high frequency bias power LF from the mounting table 12 and maximize the supply efficiency of the high frequency bias power LF to the table 12.

An electrostatic chuck 22 having an electrostatic electrode plate 21 arranged in its interior is provided at an upper portion of the mounting table 12. The electrostatic chuck 22 may be made of aluminum and have an upper surface sprayed with a ceramic material or the like. When mounting a wafer W on the mounting table 12, the wafer W is placed on an upper circular plate member of the electrostatic chuck 22.

Also, a DC power source 23 is connected to the electrostatic electrode plate 21. When a positive DC voltage (also referred to as "DC voltage HV" hereinafter) is applied to the electrostatic electrode plate 21, a negative potential is generated at a rear face of the wafer W (face toward the electrostatic chuck 22), and a potential difference is created between the electrostatic electrode plate 21 and the rear face of the wafer W. The wafer W is electrostatically attracted and held onto the upper circular plate member of the electrostatic chuck 22 by a Coulomb force or a Johnson-Rahbek force generated by the above potential difference.

Also, an annular focus ring 24 is arranged on a peripheral portion of the electrostatic chuck 22 to surround a peripheral portion of the wafer W. The focus ring 24 may be made of a conductive material such as silicon. The focus ring 24 is configured to focus the plasma within the reaction chamber 17 toward a surface of the wafer W to thereby improve efficiency of an etching process.

Also, an annular coolant chamber 25 may be arranged to extend along a circumferential direction within the mounting table 12, for example. A low temperature coolant such as cooling water or Galden (registered trademark) may be supplied from a chiller unit (not shown) to the coolant chamber 25 via a coolant pipe 26 and circulated within the coolant chamber 25. The mounting table 12 that has been cooled by the low temperature coolant cools the wafer W and the focus ring 24 via the electrostatic chuck 22.

A plurality of heat transfer gas supply holes 27 are formed on a surface of the upper circular plate member of the electrostatic chuck 22 on which the wafer W is electrostatically attracted (attracting surface). A heat transfer gas such as helium (He) may be supplied to the plurality of heat transfer gas supply holes 27 via a heat transfer gas supply line 28. The heat transfer gas is supplied to a gap between the attracting surface of the electrostatic chuck 22 and the rear face of the wafer W via the heat transfer gas supply holes 27. The heat transfer gas supplied to the gap transfers heat of the wafer W to the electrostatic chuck 22.

A shower head 29 is arranged at a ceiling portion of the chamber 11 to face the mounting table 12. A second high frequency power source 31 is connected to the showerhead 29 via a matching unit 30. The second high frequency power source 31 may supply a high frequency power for plasma excitation having a frequency around 40 MHz, for example, (also referred to as "high frequency excitation power HF" hereinafter) to the shower head 29. In this way, the shower head 29 may also act as an upper electrode. The matching unit 30 is configured to suppress reflection of the high frequency excitation power HF from the shower head 29 to thereby maximize the supply efficiency of the high frequency excitation power HF to the shower head 29. Note that in some embodiments, the second high frequency power source 31 and the matching circuit 30 may be omitted.

The shower head 29 includes a ceiling electrode plate 33 having a plurality of gas holes 32, a cooling plate 34 for detachably suspending the ceiling electrode plate 33, and a lid 35 that covers the cooling plate 34. Also, a buffer chamber 36 is provided within the cooling plate 34, and the buffer chamber 36 is connected to a gas introducing pipe 37. The shower head 29 is configured such that the gas supplied from the gas introducing pipe 37 into the buffer chamber 36 is supplied to the reaction chamber 17 via the plurality of gas holes 32.

The shower head 29 is detachable with respect to the chamber 11 and also functions as a lid of the chamber 11. When the showerhead 29 is detached from the chamber 11, an operator may directly touch the walls and components of the chamber 11. In this way, the operator may be able to clean the surfaces of the walls and components of the chamber 11 and remove extraneous matter adhered to the wall of the chamber 11, for example.

In the plasma processing apparatus 10, the high frequency bias power LF is applied to the mounting table 12 within the reaction chamber 17. The high frequency excitation power HF may also be applied to the reaction chamber 17 but does not necessarily have to be applied. By applying at least the high frequency bias power LF to the reaction chamber 17, a plasma may be generated from the gas supplied from the shower head 29, and a plasma process such as etching may be performed on the wafer W by the generated plasma. Note that operations of the various components of the plasma processing apparatus 10 are controlled by a control unit that controls the overall operation of the plasma processing apparatus 10. A CPU of the control unit controls plasma processes such as etching in accordance with a relevant recipe that sets out the procedures of the plasma process.

First Embodiment

[Plasma Processing Method]

Figure 2:
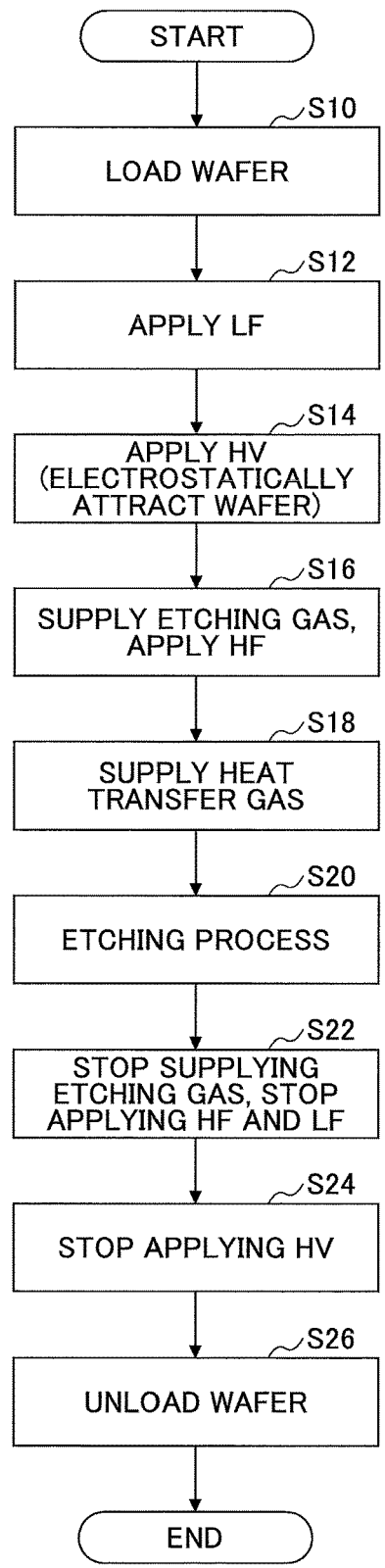
FIG. 2 is a flowchart illustrating an example of a plasma process according to a first embodiment of the present invention.

In the following, a plasma processing method according to a first embodiment of the present invention will be described with reference to FIG. 2. In the plasma processing method according to the first embodiment, a first step involves loading a wafer W into the chamber 11 where a plasma process is to be executed (step S10).

Then, the high frequency bias power LF is applied to the mounting table 12 (step S12). Then, the DC voltage HV is applied to the electrostatic electrode plate 21 of the electrostatic chuck 22 (step S14). In this way, the wafer W may be electrostatically attracted to the electrostatic chuck 22.

Then, while an etching gas is supplied to the chamber 11 to maintain the interior of the chamber 11 at a predetermined pressure, the high frequency excitation power HF is applied to the chamber 11 (step S16). In this way, a plasma may be generated. Then, a heat transfer gas is supplied between the rear face of the wafer W and the surface of the electrostatic chuck 22 (step S18), and in such a state, an etching process is performed by the generated plasma (step S20). After the etching process, the supply of the etching gas is stopped, and the application of the high frequency excitation power HF and the high frequency bias power LF are stopped (step S22).

Then, the application of the DC voltage HV is stopped (step S24). In this way, the wafer W may be released from the electrostatic attraction to the electrostatic chuck 22. Then, the wafer W is unloaded from the chamber 11 (step S26), and the present process ends at this point. Note that the above process steps are performed with respect to each wafer W.

Arcing (abnormal discharge) is prone to occur at the surface of the wafer W when the wafer W is electrostatically attracted to the electrostatic chuck 22 (chuck on) by applying the DC voltage HV.

Accordingly, in the plasma processing method according to the present embodiment, the high frequency bias power LF is applied before applying the DC voltage HV (also referred to as "pre-enclosure" by LF). In this way, when the DC voltage HV is applied, particles within the chamber 11 may be prevented from being drawn toward the wafer W by the plasma generated in the chamber 11.

Specifically, when the DC voltage HV is applied to the electrostatic chuck 22, the potential state of the wafer W is altered. When the potential state of the wafer W is altered, a potential difference is created between the mounting table 12 where the high frequency bias power LF is applied and its surrounding members. As a result, particles become more prone to be electrically drawn toward the wafer W.

Figure 3:
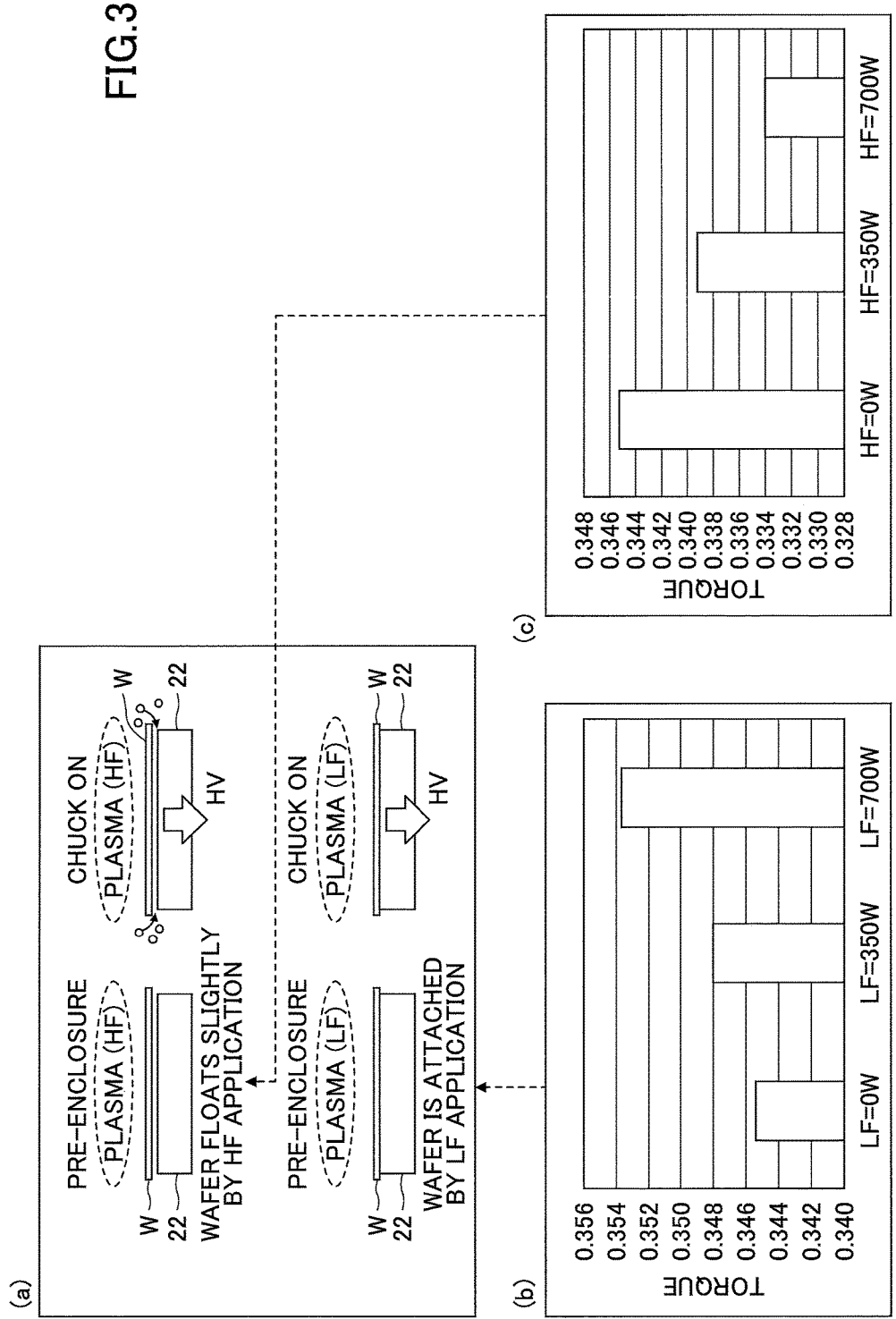
FIG. 3 illustrates exemplary results of applying a high frequency excitation power HF and a high frequency bias power LF.

FIG. 3 illustrates a comparison between a case of applying the high frequency excitation power HF before applying the DC voltage HV to electrostatically attract the wafer W (pre-enclosure by HF) and a case of applying the high frequency bias power LF before applying the DC voltage HV (pre-enclosure by LF). The high frequency excitation power HF has a higher power than the high frequency bias power LF. Thus, when the high frequency excitation power HF is applied, a plasma with a higher density is generated compared to the plasma that would be generated when the high frequency bias power LF is applied. As a result, a charge between the rear face of the wafer W and the surface of the electrostatic chuck 22 may be easily discharged toward the plasma, and the charge between the rear face of the wafer W and the surface of the electrostatic chuck 22 may be removed. In such a case, the electrostatic attraction force between the rear face of the wafer W and the surface of the electrostatic chuck 22 may be reduced, and as a result, the wafer W may float above the electrostatic chuck 22 as illustrated in the upper side of diagram (a) of FIG. 3.

Also, as can be appreciated from graph (c) of FIG. 3, as the power of the high frequency excitation power HF is increased from 0 W→350 W→700 W, the torque between the rear face of the wafer W and the surface of the electrostatic chuck 22 decreases and the wafer W tends to float higher above the electrostatic chuck 22. As a result, an electric discharge (arcing) may occur between the rear face of the wafer W and the surface of the electrostatic chuck 22, and particles may be generated. Further, the particles may easily enter the gap between the rear face of the wafer W and the surface of the electrostatic chuck 22.

On the other hand, in the present embodiment, the high frequency bias power LF is applied before electrostatically attracting the wafer W (pre-enclosure by LF). In this case, the density of the generated plasma is lower than the case where the high frequency excitation power HF is applied, and the charge between the rear face of the wafer W and the surface of the electrostatic chuck 22 is less likely to be discharged as compared to the case where the high frequency excitation power HF is applied. In this way, the wafer W may be adhered to the electrostatic chuck 22. As a result, there would hardly be any gap formed between the rear face of the wafer W and the surface of the electrostatic chuck 22, and as such, particles may be prevented from being drawn toward the wafer W. Thus, in the plasma processing method according to the present embodiment, particles may be prevented from being generated in the vicinity of the wafer W when electrostatically attracting the wafer W onto the electrostatic chuck 22.

Also, as can be appreciated from graph (b) of FIG. 3, as the power of the high frequency bias power LF is increased from 0 W→350 W→700 W, the torque between the rear face of the wafer W and the surface of the electrostatic chuck 22 increases.

It can be appreciated from the above result that the electrostatic attraction force between the rear face of the wafer W and the surface of the electrostatic chuck 22 may be increased by increasing the power of the high frequency bias power LF. In this way, an electric discharge (arcing) between the rear face of the wafer W and the surface of the electrostatic chuck 22 may be more effectively prevented, and the generation of particles can be further reduced. Also, because the gap between the rear face of the wafer W and the surface of the electrostatic chuck 22 can be reduced, particles may be effectively prevented from being drawn toward the wafer W.

As can be appreciated from the above, in the plasma processing method according to the present embodiment, by applying the high frequency bias power LF before applying the DC voltage HV, the occurrence of arcing may be suppressed and particles may be prevented from being drawn toward the wafer W.

Second Embodiment

[Plasma Processing Method]

Figure 4:
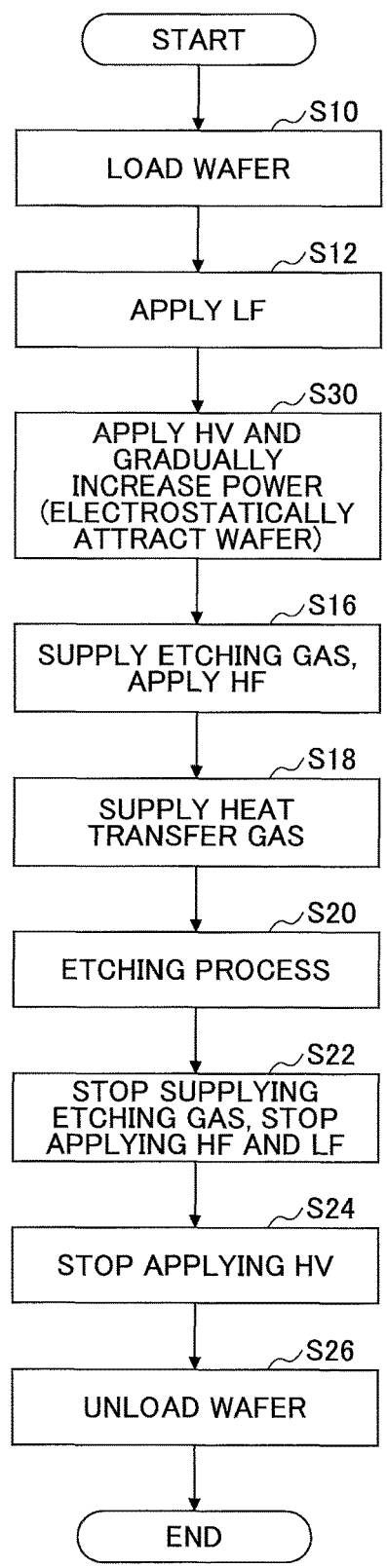
FIG. 4 is a flowchart illustrating an example of a plasma process according to a second embodiment of the present invention.

In the following, a plasma processing method according to a second embodiment of the present invention will be described with reference to FIG. 4. In the plasma processing method according to the second embodiment, a first step involves loading a wafer W into the chamber 11 where a plasma process is to be executed (step S10).

Then, after applying the high frequency bias power LF to the mounting table 12 (step S12), and applying the DC voltage HV to the electrostatic electrode plate 21 of the electrostatic chuck 22, the power of the DC voltage HV is gradually increased in stages (step S30). In this way, the wafer W may be electrostatically attracted to the electrostatic chuck 22.

Then, while an etching gas is supplied to the chamber 11 to maintain the interior of the chamber 11 at a predetermined pressure, the high frequency excitation power HF is applied to the chamber 11 (step S16). In this way, a plasma may be generated. Then, a heat transfer gas is supplied between the rear face of the wafer W and the surface of the electrostatic chuck 22 (step S18), and in such a state, an etching process is performed by the generated plasma (step S20). After the etching process, the supply of the etching gas is stopped, and the application of the high frequency excitation power HF and the high frequency bias power LF are stopped (step S22).

Then, the application of the DC voltage HV is stopped (step S24). In this way, the wafer W may be released from the electrostatic attraction to the electrostatic chuck 22. Then, the wafer W is unloaded from the chamber 11 (step S26), and the present process ends at this point.

As described above, in the plasma processing method according to the second embodiment, the high frequency bias power LF is applied before electrostatically attracting the wafer W. In this way, particles within the chamber 11 may be prevented from being drawn toward the wafer W by the generated plasma when the DC voltage HV is applied.

Further, in the plasma processing method according to the second embodiment, the DC voltage HV is controlled to increase gradually in stages. In this way, the strength of the electric field applied to the mounting table 12 may be gradually increased. As a result, a potential difference between the mounting table 12 and its surrounding members may be prevented from abruptly increasing, and a relatively small potential difference may be maintained when the DC voltage HV is applied in stages. In this way, a force drawing particles toward the wafer W that is generated when the DC voltage HV is turned on may be weakened and particles in the vicinity of the wafer W may be further reduced.

Figure 5A:
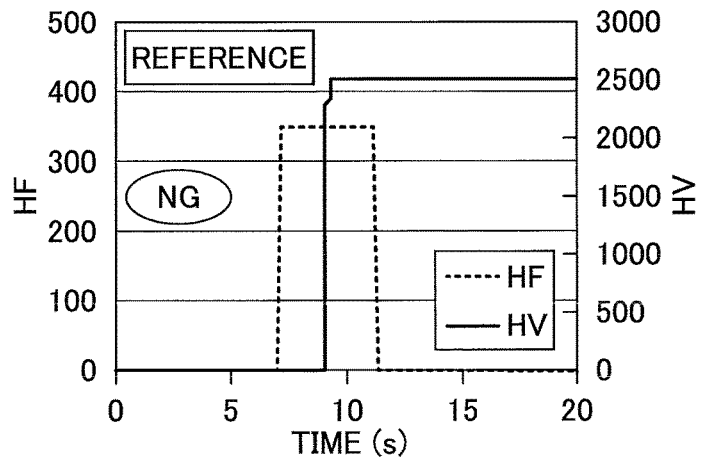
FIGS. 5A-5F illustrate exemplary results of gradually increasing a DC voltage HV that is applied in the plasma process according to the second embodiment.

For example, FIGS. 5A-5F illustrate experimental results of controlling the power of the DC voltage HV. Referring to FIG. 5A illustrating a comparative example (reference), when the DC voltage HV is abruptly applied, a relatively large potential difference is created between the mounting table 12 and its surrounding members, and as a result, particles are generated in the vicinity of the wafer W (NG).

Figure 5B:
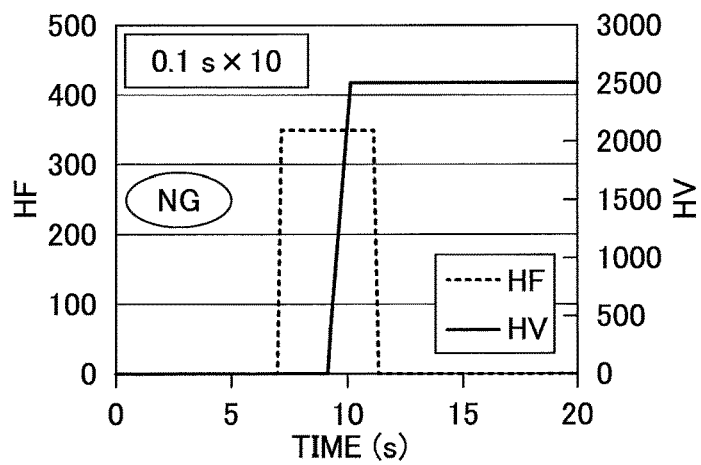
Figure 5C:
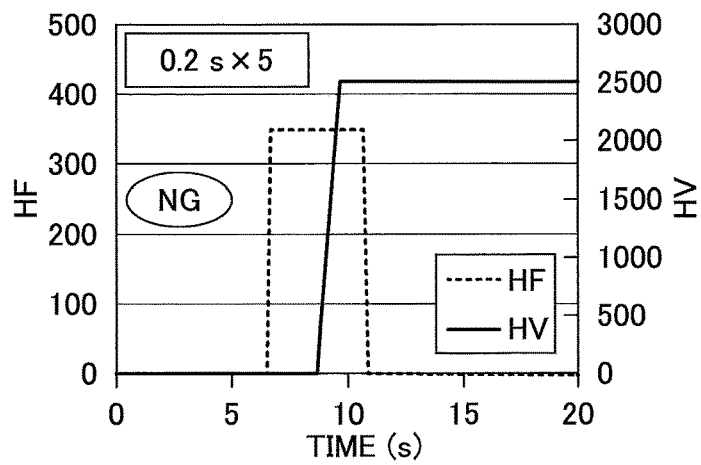

In the examples illustrated in FIGS. 5B and 5C, although the DC voltage HV is applied less abruptly than in the case of FIG. 5A, there is still a sharp increase in the DC voltage HV such that a relatively large potential difference is created between the mounting table 12 and its surrounding members. As such, particles are electrically attracted to the vicinity of the wafer W, and the generation of particles in the vicinity of the wafer W cannot be effectively prevented (NG).

Figure 5D:
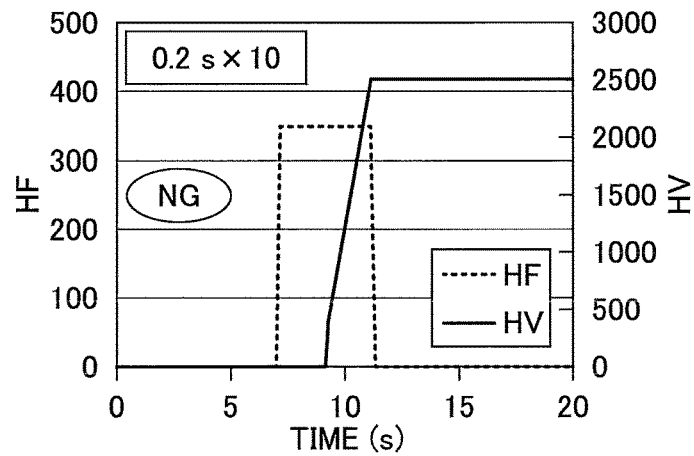
Figure 5E:
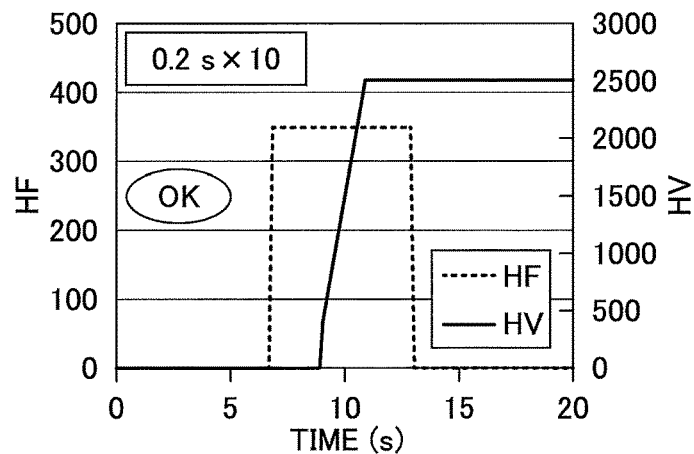
Figure 5F:
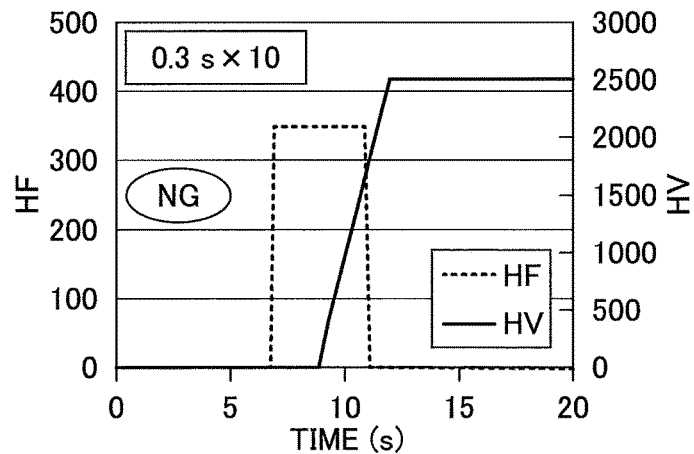

In the examples illustrated in FIGS. 5D and 5F, the DC voltage HV is increased more gradually, but the application of the high frequency excitation power HF is stopped too soon such that pre-enclosure by the high frequency excitation power HF is not adequately achieved. As a result, the generation of particles in the vicinity of the wafer W cannot be effectively prevented (NG).

In the example illustrated in FIG. 5E, adequate pre-enclosure by the high frequency excitation power HF is achieved and the DC voltage HV is gradually and partially linearly increased in stages such that the potential difference between the mounting table 12 and its surrounding members may be reduced, and the generation of particles in the vicinity of the wafer 5 W may be effectively prevented (OK).

Thus, in the plasma processing method according to the second embodiment, by controlling the power of the DC voltage HV to gradually increase in addition to controlling pre-enclosure, the generation of particles in the vicinity of the wafer W may be effectively prevented when electrostatically attracting the wafer W onto the electrostatic chuck 22.

Note that in the experimental examples illustrated in FIGS. 5A-5F, pre-enclosure is implemented by the high frequency excitation power HF. However, similar effects may be obtained in the case of implementing pre-enclosure by the high frequency bias power LF. That is, according to embodiments of the present invention, step S12 of FIG. 4 may involve applying at least one of the high frequency bias power LF and the high frequency excitation power HF.

Third Embodiment

[Plasma Processing Method]

Figure 6:
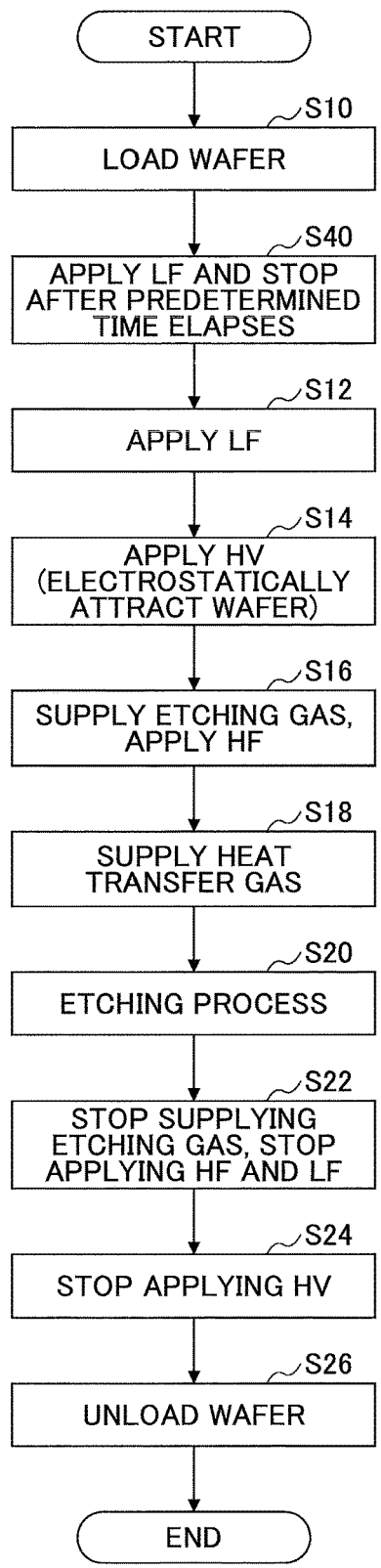
FIG. 6 is a flowchart illustrating an example of a plasma process according to a third embodiment of the present invention.

In the following, a plasma processing method according to a third embodiment of the present invention will be described with reference to FIG. 6. In the plasma processing method according to the third embodiment, a first step involves loading a wafer W into the chamber 11 where a plasma process is to be executed (step S10).

Then, the high frequency bias power LF is applied to the mounting table 12 for a predetermined time period, and after the predetermined time period elapses, the application of the high frequency bias power LF is stopped (step S40: LF application in advance).

Then, the high frequency bias power LF is applied to the mounting table 12 (step S12). Then, the DC voltage HV is applied to the electrostatic electrode plate 21 of the electrostatic chuck 22 (step S14). Note that as for the method of applying the high frequency bias power LF, the high frequency bias power LF may be abruptly applied or controlled to increase in stages, for example.

Then, while an etching gas is supplied to maintain the interior of the chamber 11 at a predetermined pressure, the high frequency excitation power HF is applied to the chamber 11 (step S16). In this way, a plasma is generated. Then, a heat transfer gas is supplied between the rear face of the wafer W and the surface of the electrostatic chuck 22 (step S18), and in such a state, an etching process is performed by the generated plasma (step S20). After the etching process, the supply of the etching gas is stopped, and the application of the high frequency excitation power HF and the high frequency bias power LF is stopped (step S22).

Then, the application of the DC voltage HV is stopped (step S24). In this way, the wafer W is released from the electrostatic attraction to the electrostatic chuck 22. Then, the wafer W is unloaded from the chamber 11 (step S26), and the present process ends at this point.

As described above, in the plasma processing method according to the third embodiment, the high frequency bias power LF is applied before the DC voltage HV is applied (pre-enclosure by LF). In this way, the occurrence of arcing by the generated plasma may be prevented when the wafer W is electrostatically attracted to the electrostatic chuck 22. In turn, particles within the chamber 11 may be prevented from being drawn toward the wafer W by the generated plasma when the DC voltage HV is applied.

Figure 7A:
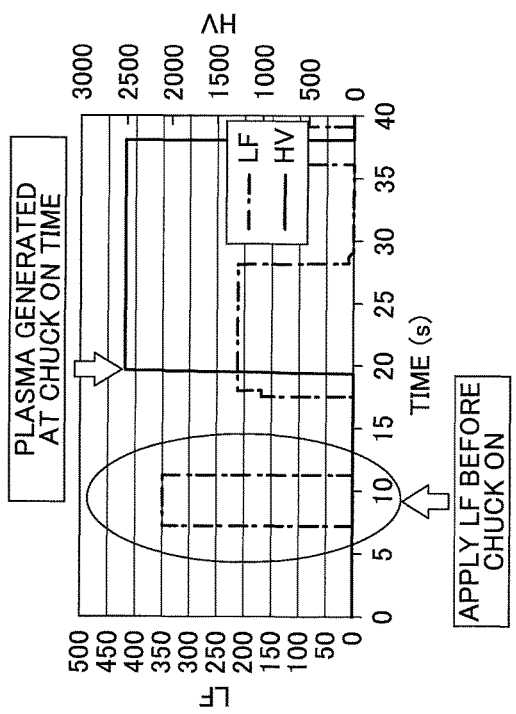
FIGS. 7A and 7B illustrate an example of applying the high frequency bias power LF in advance for a predetermined time period according to the third embodiment.

Also, as illustrated in FIG. 7A, in the present embodiment, before applying the high frequency bias power LF for pre-enclosure, the high frequency bias power LF of about 350 W is applied for a predetermined time period in a state where the wafer W is not electrostatically attracted to the electrostatic chuck 22. Note that although the predetermined time period is several seconds in the graph of FIG. 7A, it is not limited thereto and may be several tens of seconds, for example. In this way, a torque may be applied between the rear face of the wafer W and the surface of the electrostatic chuck 22, and the electrostatic attraction force between the rear face of the wafer W and the surface of the electrostatic chuck 22 may be further increased. Thus, as illustrated in FIG. 7B, by applying the high frequency bias power LF in advance, a gap between the wafer W and the electrostatic chuck 22 (gap G) may be reduced as compared with a case where the high frequency excitation power HF is applied.

Figure 7B:
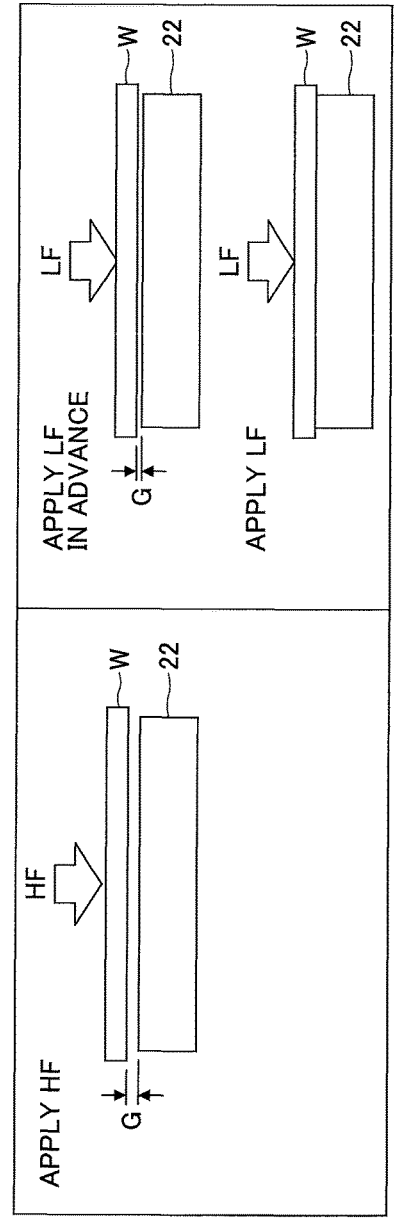

Then, as illustrated in FIG. 7B, when the high frequency bias power LF is applied once again for pre-enclosure, the electrostatic attraction force between the rear face of the wafer W and the surface of the electrostatic chuck 22 may be further increased such that the wafer W may adhere to the electrostatic chuck 22. In this way, an electric discharge (arcing) between the rear face of the wafer W and the surface of the electrostatic chuck 22 may be suppressed, and the generation of particles in the vicinity of the wafer W may be further reduced.

Although a plasma processing method according to the present invention has been described above with respect to certain illustrative embodiments, the plasma processing method according to the present invention is not limited to the above embodiments, and various modifications and improvements may be made within the scope of the present invention. Also, the various features of the embodiments described above may be combined to the extent practicable.

For example, in the plasma processing method according to the first to third embodiments, the high frequency bias power LF is applied for pre-enclosure. However, in other embodiments of the plasma processing method according to the present invention, the high frequency excitation power HF and the high frequency bias power LF may be applied for pre-enclosure, for example.

Also, the plasma processing method according to the present invention is not limited to being implemented by a capacitively coupled plasma (CCP) processing apparatus but may also be implemented by other various types of plasma processing apparatuses. Examples of other types of plasma processing apparatuses include an inductively coupled plasma (ICP) processing apparatus, a helicon wave plasma (HWP) processing apparatus, an electron cyclotron resonance plasma (ECR) processing apparatus, and the like.

Also, a substrate that is subject to processing by the plasma processing method according to the present invention is not limited to a semiconductor wafer but may be a large substrate for a flat panel display (FPD), an electroluminescence (EL) element, or a substrate for a solar battery, for example.

The present application is based on and claims the benefit of priority to Japanese Patent Application No. 2015-000694 filed on Jan. 6, 2015, the entire contents of which are hereby incorporated by reference.

What is claimed is:

1. A plasma processing method comprising:
   a step of loading a substrate into a chamber where a plasma process is to be executed;
   a step of mounting the substrate on a mounting table;
   a first step of applying a bias power to the mounting table for a predetermined time period,
   stopping the bias power after the predetermined time period, the bias power having a frequency that is lower than a frequency of excitation power for plasma excitation;
   a second step of applying the bias power to the mounting table on which the substrate is mounted before applying an excitation power for plasma excitation;
   a step of applying a DC voltage to an electrostatic chuck and electrostatically attracting the substrate that is mounted on the mounting table;
   a step of supplying etching gas in the chamber; and
   a step of applying the excitation power for the plasma excitation,
   wherein the first step of applying the bias power and the second step of applying the bias power are performed on an identical substrate as one cycle before the DC voltage is applied on the electrostatic chuck so as to electrostatically attract the substrate by the electrostatic chuck,
   wherein the first and second steps of applying the bias power are performed before supplying the etching gas, and
   wherein the bias power of the first and the second steps are the same bias power and applied by one high frequency power source.

2. The plasma processing method according to claim 1, wherein the step of applying the DC voltage is performed after the step of applying at least one of the excitation power and the bias power; and
   wherein the DC voltage being applied is partially linearly increased.

3. The plasma processing method according to claim 1, wherein the frequency of the bias power is greater than or equal to 400 kHz and less than or equal to 13.56 MHz.

4. The plasma processing method according to claim 1, wherein the step of applying the excitation power for the plasma excitation is performed after the step of applying the DC voltage begins.

5. The plasma processing method according to claim 1, wherein each of the first and second steps of applying the bias power to the mounting table are performed before applying the DC voltage on the electrostatic chuck, thereby preventing arcing between the substrate and the electrostatic chuck.

6. The plasma processing method according to claim 1, wherein the method includes an interval between the first and second steps of applying the bias power to the mounting table.

7. The plasma processing method according to claim 1, wherein the first step of applying the bias power to the mounting table is performed for a couple of seconds by the bias power at approximately 350 W.

8. The plasma processing method according to claim 1, wherein the step of applying the excitation power for the plasma excitation is performed after the step of stopping the bias power.

* * * * *